US008656260B1

(12) United States Patent
Barman et al.

(10) Patent No.: US 8,656,260 B1
(45) Date of Patent: Feb. 18, 2014

(54) METHODS AND CIRCUITS FOR PROCESSING A DATA BLOCK BY FRAMES

(75) Inventors: Kaushik Barman, Hyderabad (IN); Heramba Aligave, Hyderabad (IN); Sarvendra Govindammagari, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 373 days.

(21) Appl. No.: 13/194,234

(22) Filed: Jul. 29, 2011

(51) Int. Cl.
*H03M 13/00* (2006.01)

(52) U.S. Cl.
USPC .......................................................... 714/781

(58) Field of Classification Search
USPC .................................. 714/752, 781, 786
See application file for complete search history.

(56) References Cited

U.S. PATENT DOCUMENTS

| 6,260,173 B1 * | 7/2001 | Weng et al. ............ 714/781 |
| 6,910,172 B2 * | 6/2005 | Hara et al. ............ 714/757 |
| 8,095,859 B1 * | 1/2012 | Peterson et al. ............ 714/801 |
| 2012/0304041 A1 * | 11/2012 | Gammel ............ 714/807 |

OTHER PUBLICATIONS

IEEE, *IEEE Standard for Information Technology—Telecommunications and information exchange between systems—Local and Metropolitan Area Networks—Specific Requirements* (Part 3: Carrier Sense Multiple Access with Collision Detection (CSMA/CD) Access Method and Physical Layer Specifications, Amendment 4: Ethernet Operation over Electrical Backplanes), IEEE Std 802.3ap-2007, May 22, 2007, pp. 1-203, IEEE, New York, New York, USA.
Lin, Shu et al., *Error Control Coding: Fundamentals and Applications*, 1983, Chapter 3, pp. 51-84, Prentice Hall, Upper Saddle River, New Jersey, USA.
Lin, Shu et al., *Error Control Coding: Fundamentals and Applications*, 1983, Chapter 4, pp. 85-124, Prentice Hall, Upper Saddle River, New Jersey, USA.

* cited by examiner

*Primary Examiner* — Shelly A Chase
(74) *Attorney, Agent, or Firm* — LeRoy D. Maunu; Lois D. Cartier

(57) ABSTRACT

Methods and circuits process a data block of first bits. A circuit includes a register and a parallel combiner. The register is configured to store second bits. The second bits are iteratively a partial parity for each of multiple frames of the data block. The parallel combiner is coupled to the register and configured to generate a combination of bits from third bits and the second bits from the register. These third bits are iteratively those of the first bits within each of the frames of the data block. The circuit also includes respective exclusive-or circuits associated with the second bits. These exclusive-or circuits are coupled to the parallel combiner and the register. The respective exclusive-or circuit for each second bit is configured to generate the second bit from the combination of bits.

20 Claims, 3 Drawing Sheets

METHODS AND CIRCUITS FOR PROCESSING A DATA BLOCK BY FRAMES

FIELD OF THE INVENTION

One or more embodiments generally relate to error correcting circuits, and more particularly to parallel implementations of generator and checker circuits for forward error correction using block codes.

BACKGROUND

Block codes for forward error correction have many applications for protecting data integrity in communication and mass storage systems. Block codes protect a data block by adding redundancy, typically by adding redundant parity check bits to the end of the data block. The encoder computes the parity check bits. The decoder uses the parity check bits to determine whether the data block is corrupted, and to potentially correct a corrupted data block.

There is a general need for data protection circuits that have high throughput and low latency in a variety of circuit implementation technologies.

SUMMARY

In one embodiment, a circuit for processing a data block of first bits includes a register and a parallel combiner. The register is configured to store second bits. The second bits are iteratively a partial parity for each frame of multiple frames of the data block. The parallel combiner is coupled to the register and configured to generate a combination of bits from third bits and the second bits from the register. These third bits are iteratively those of the first bits within each of the frames of the data block. The circuit also includes respective exclusive-or circuits associated with the second bits. These exclusive-or circuits are coupled to the parallel combiner and the register. The respective exclusive-or circuit associated with each second bit is configured to generate the second bit from the combination of bits.

In another embodiment, a circuit for processing a data block of first bits includes a register and a parallel combiner. The register is configured to store second bits. The second bits are iteratively a partial parity for each of multiple frames of the data block. The parallel combiner is coupled to the register and configured to generate a bit-wise exclusive-or combination of bits from the second bits from the register and corresponding third bits. The third bits are iteratively those of the first bits within each of the frames of the data block. The circuit also includes respective exclusive-or circuits associated with the second bits. These exclusive-or circuits are coupled to the parallel combiner and the register. The respective exclusive-or circuit associated with each second bit is configured to generate the second bit from an exclusive-or summation of a subset of fourth bits of the bit-wise exclusive-or combination of bits. Each fourth bit in the subset of the respective exclusive-or circuit associated with each second bit corresponds to a non-zero value of an entry in a generator matrix at a respective row for the second bit and a respective column for the fourth bit.

A method generates a circuit for processing a data block in another embodiment. A number W is input. Each of the frames of the data block includes W bits. A specification of a generator polynomial is input. The specification specifies a number D equaling a degree of the generator polynomial. A generator matrix is calculated from the generator polynomial, and the generator matrix has D rows and W columns. A description is generated of a register that iteratively stores D bits of a partial parity for each of the frames. A description is generated of a parallel combiner that iteratively generates W bits of a combination of bits for each frame. The W bits of the combination include a bit-wise exclusive-or between the D bits of the partial parity from the register and D of the W bits in the frame. A description is generated of D exclusive-or circuits that iteratively generate the D bits of the partial parity for each successive frame. A respective one of the D exclusive-or circuits for each bit of the D bits generates the bit from a corresponding subset of the W bits of the combination of bits. The corresponding subset includes each one of the W bits for which the generator matrix includes a non-zero entry at a respective one of the D rows for the bit of the D bits and a respective one of the W columns for the one of the W bits. The descriptions of the register, the parallel combiner, and the D exclusive-or circuits are output.

It will be appreciated that other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

The present invention is applicable to a variety of circuits, methods, and codes. An appreciation of the present invention is presented by way of specific examples utilizing binary linear block codes. However, the present invention is not limited by these examples, and can be applied to other codes, such as non-binary linear block codes.

Figure 1:
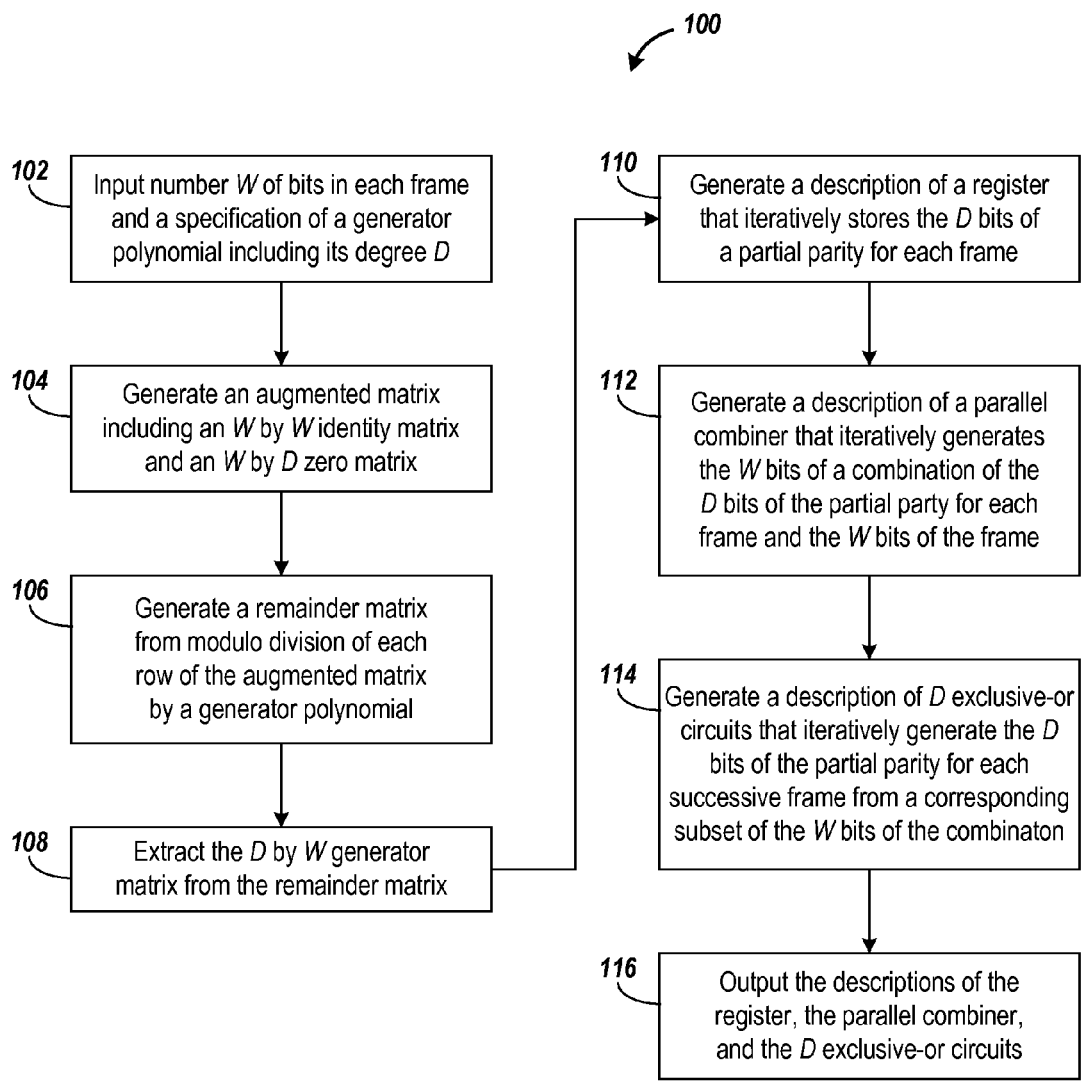
FIG. 1 is a flow diagram of a process for generating a circuit that processes a data block.

FIG. 1 is a flow diagram of a process 100 for generating a circuit that processes a data block. In one embodiment, the circuit generates redundant parity bits for the data block, and a transmitter transmits the data block together with the parity bits. In another embodiment, the circuit generates a syndrome or a cyclic shift of the syndrome, and a receiver receives the data block and corrects corruption of the data block using the syndrome or its cyclic shift.

An (n, k) block code encodes k message bits in a data block of n bits. For a systematic block code, the n-bit data block includes the k message bits and n−k redundant parity bits. For a linear block code, a generator polynomial or matrix generates the parity bits of the data block from the messages bits of the data block. For example, 10GBASE-KR of the IEEE 802.3ap-2007 standard defines Ethernet over electrical backplanes at a line rate of 10.3125 gigabits per second using a (2112, 2080) systematic linear block code that shortens a (42987, 42955) block code by setting the leading 40875 message bits to zero. This (2112, 2080) block code uses the generator polynomial:

$$g(x)=X^{32}+X^{23}+X^{21}+X^{11}+X^2+1$$

to generate the parity bits:

$$p(x)=x^{32}m(x) \bmod g(x)$$

where p(x) is a polynomial for the 32 parity bits and m(x) is a polynomial for the 2080 message bits.

At block 102, the number W of bits in each frame of the data block is input. Also input is a specification of a generator polynomial, and the specification specifies a number D equaling a degree of the generator polynomial. The degree of the above generator polynomial for 10GBASE-KR is 32.

Certain circuit implementation technologies cannot generate or check parity bits using a serial circuit operating at the line rate. Thus, a parallel circuit generates the parity check bits in the transmitter and a similar parallel circuit checks the parity check bits in the receiver in one embodiment. The parallel circuit in the transmitter inputs each data block of k messages bits, calculates parity bits for the data block, appends the parity bits to the data block, and outputs the resulting encoded data block of n message and parity bits. The similar parallel circuit in the receiver inputs the encoded data block of n message and parity bits, calculates parity bits that may be a syndrome for the data block, and checks whether the calculated parity bits indicate corruption of the encoded data block of n message and parity bits. Thus, a parallel circuit in the transmitter inputs k-bit data blocks and a similar parallel circuit in the receiver inputs n-bit data blocks in one embodiment. For an embodiment of the example of 10GBASE-KR, the transmitter includes a parallel circuit encoding each data block of 2080 bits, and the receiver includes a parallel circuit checking each data block of 2112 bits. However, in another embodiment, the receiver includes a parallel circuit that inputs k-bit data blocks that are the k message bits extracted from each incoming n-bit data block, and the receiver checks that the calculated parity bits match the parity bits from the incoming n-bit data block.

To generalize the possible sizes of incoming data blocks that could differ between the transmitter and the receiver, the incoming data block processed by the parallel circuit is denoted a data block of N bits. For an embodiment of the example of 10GBASE-KR, the transmitter includes a parallel circuit encoding data blocks of N=2080 bits, and the receiver includes a parallel circuit checking data blocks of N=2112 bits. The following describes the operation of a parallel circuit that inputs data blocks of N bits in either the transmitter or the receiver.

Each data block of N bits is split into Q frames each having W bits, and each parallel circuit processes the W bits of each frame in parallel (such that N=WQ). In one embodiment, the parallel circuit processes the frames with low latency because the parallel circuit processes each frame as the frame becomes available at a transmitter or a receiver. In addition, the parallel circuit processes the frames with high throughput because of the parallel processing of the parallel circuit.

A matrix formulation provides the structure of the parallel circuit. Each clock cycle, the parallel circuit calculates a partial parity from the preceding cycle's partial parity and the W bits of the incoming frame for the clock cycle:

$$P_{D\times 1}(j) = G_{D\times W}\left(M_{W\times 1}(j) \oplus \begin{bmatrix} P_{D\times 1}(j-1) \\ 0_{(W-D)\times 1} \end{bmatrix}\right)$$

where $P_{D\times 1}(j)$ is a column vector of the D bits of the partial parity for the frame with index j, $G_{D\times W}$ is a generator matrix per frame derived from the generator polynomial, $M_{W\times 1}(j)$ is a column vector of the W message bits of the frame with index j, and $0_{(W-D)\times 1}$ is a zero or null matrix that augments the prior partial parity $P_{D\times 1}(j-1)$ to produce a column vector of W bits that matches the W bits of $M_{W\times 1}(j)$. Because D is less than W in one embodiment, the bit-wise exclusive-or is an exclusive-or between each bit of $M_{W\times 1}(j)$ and either a corresponding bit of $P_{D\times 1}(j-1)$ or a zero bit of $0_{(W-D)\times 1}$. In another embodiment, the bit-wise exclusive-or between the frame $M_{W\times 1}(j)$ and the preceding partial parity $P_{D\times 1}(j-1)$ is an exclusive-or between each bit of $P_{D\times 1}(j-1)$ and a corresponding one of the more significant bits of $M_{W\times 1}(j)$, and this bit-wise exclusive-or forwards the least significant W−D bits of the frame $M_{W\times 1}(j)$. At the index j of the final one of the Q frames of each data block, $P_{D\times 1}(j)$ becomes the final parity for the data block.

The generator matrix per frame is given by successive Euclidian division of each row of an augmented matrix by the generator polynomial:

$$H_{W\times(W+D)} = [I_{W\times W} \mid 0_{W\times D}] \xrightarrow{mod\ g(x)\ on\ each\ row} R_{W\times(W+D)} = [0_{W\times W} \mid G^T_{W\times D}]$$

where $H_{W\times(W+D)}$ is the augmented matrix and $R_{W\times(W+D)}$ is a remainder matrix that includes the transpose $G_{W\times D}^T$ of the generator matrix per frame.

At block 104, the augmented matrix is generated that includes an identity matrix and a zero matrix. The identity matrix has W rows and W columns, and the zero matrix (or null matrix) has W rows and D columns.

At block 106, the remainder matrix is generated from modulo division of each of the W rows of the augmented matrix by the generator polynomial. The remainder matrix includes another zero matrix and a transpose of the generator matrix. This zero matrix has W rows and W columns, and the transpose of the generator matrix has W rows and D columns.

At block 108, the generator is extracted from the remainder matrix. The generator matrix has D rows and W columns. Thus, blocks 104, 106, and 108 calculate the generator matrix from the generator polynomial.

At block 110, a description is generated for a register that iteratively stores the D bits of the partial parity for each frame. At the final frame of each data block, the register stores the final parity for the data block in one embodiment.

At block 112, a description is generated for a parallel combiner. The parallel combiner iteratively generates W bits of a bit-wise combination for each frame. The bit-wise combination includes a bit-wise exclusive-or between the D bits of the register's partial parity and the upper D of the W bits in the frame.

At block 114, a description is generated for D exclusive-or circuits. Iteratively over the successive frames, the D exclusive-or circuits generate the D bits of the partial parity for each frame. For each bit of a partial parity, a respective one of the D exclusive-or circuits generates the bit of the partial parity from a corresponding subset of the W bits of the bit-wise combination. The corresponding subset includes each bit of the bit-wise combination for which the generator matrix includes a non-zero entry at a respective one of the D rows for the bit of the partial parity and a respective one of the W columns for the bit of the combination.

At block 116, the descriptions of the register, the parallel combiner, and the D exclusive-or circuits are output. A circuit for processing data blocks can be synthesized from these descriptions.

Figure 2:
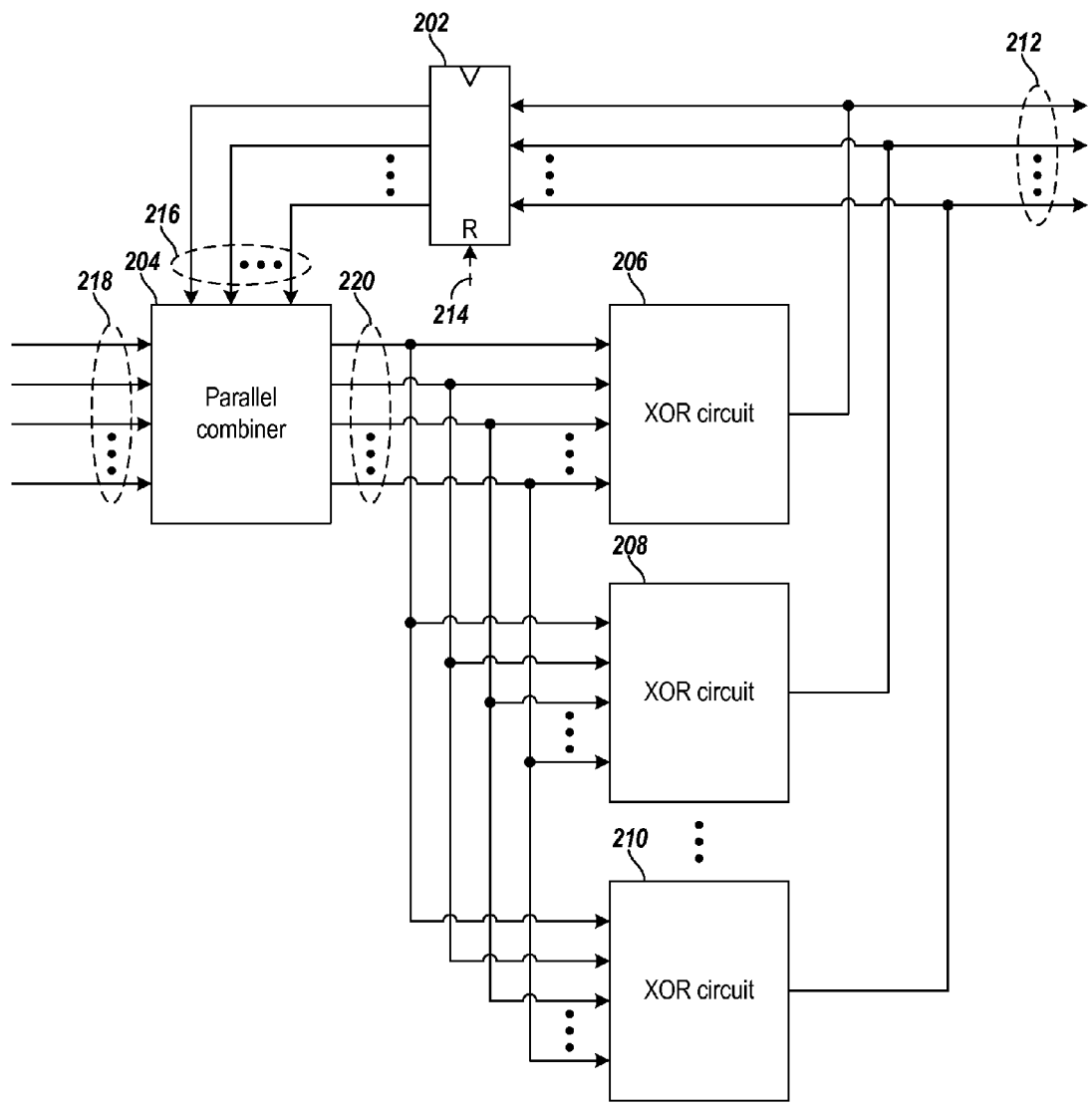
FIG. 2 is a block diagram of a circuit for processing a data block to generate or check redundant parity bits for the data block.

FIG. 2 is a block diagram of a circuit for processing a data block to generate or check redundant parity bits for the data block. The circuit includes a register 202, a parallel combiner 204, and exclusive-or circuits 206, 208, through 210.

The register 202 is configured to store bits that are iteratively a partial parity for each frame of the data block. In one embodiment, while the exclusive-or circuits 206, 208, through 210 are outputting the final parity on lines 212 at the final frame of the data block, the optional control signal on line 214 initializes register 202 to an initial value of zero for the initial partial parity of the next data block. Consequently, register 202 does not store the partial parity that is the final parity at the final frame of each data block. In another embodiment, at the initial frame of each data block the register 202 is initialized to the initial frame's partial parity from exclusive-or circuits 206, 208, through 210, and at the final frame register 202 stores the final parity for the data block.

The parallel combiner 204 is coupled to the register 202 and configured to iteratively generate successive combinations of the partial parity on lines 216 and each incoming frame on lines 218. Each combination on lines 220 includes a bit-wise exclusive-or between the bits of the partial parity on lines 216 and corresponding bits of the incoming frame on lines 218. In one embodiment, the bits of the partial parity on lines 216 number fewer than the bits of the incoming frame on lines 218, and the combination on lines 220 forwards those additional bits of the incoming frame on lines 218 that do not correspond to any bit of the partial parity on lines 216.

The exclusive-or circuits 206, 208, through 210 are coupled to the parallel combiner 204 and the register 202. The exclusive-or circuits 206, 208, through 210 have a respective exclusive-or circuit for each bit of the partial products iteratively stored in register 202. The respective exclusive-or circuit for each bit of register 202 is configured to generate the bit from an exclusive-or summation of a subset of the bits of the combination on lines 220. Each combination bit in the subset of the exclusive-or circuit 206 corresponds to a non-zero value of an entry in a generator matrix at a respective row for the parity bit generated by exclusive-or circuit 206 and a respective column for the combination bit. The exclusive-or circuits 208 through 210 similarly generate respective bits of the partial parity using an exclusive-or summation of the subset combination bits specified in additional rows of the generator matrix.

Figure 3:
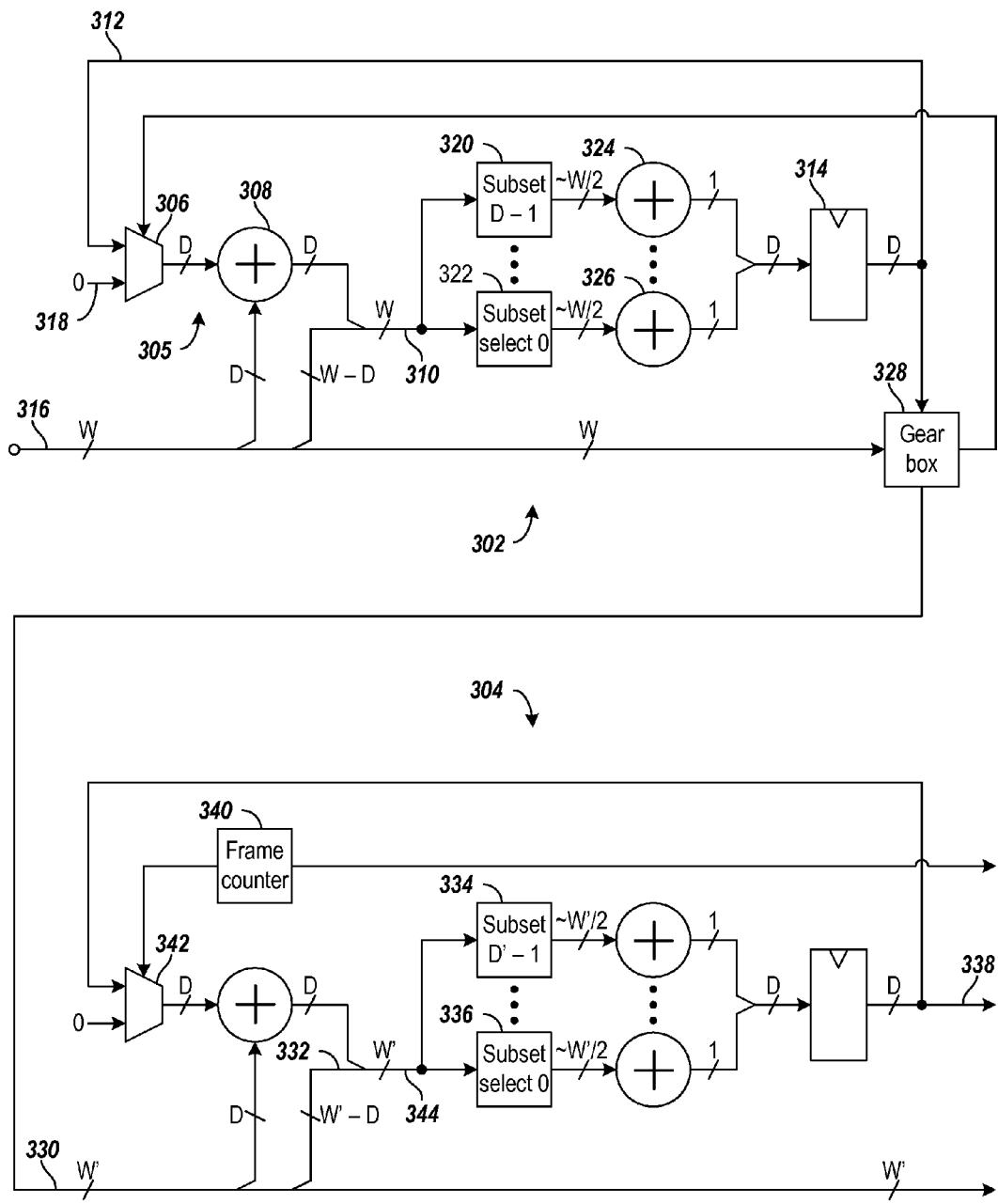
FIG. 3 is a block diagram of a transmitter and receiver that process data blocks transferred from the transmitter to the receiver.

FIG. 3 is a block diagram of a transmitter 302 and receiver 304 that process data blocks transferred from the transmitter 302 to the receiver 304. The transmitter 302 calculates redundant parity bits added to the message bits of each data block, and the receiver 304 checks the message bits and the parity bits to detect and correct corruption of each data block.

A parallel combiner 305 of transmitter 302 includes a multiplexer 306 and an exclusive-or circuit 308. The parallel combiner 305 iteratively generates a combination on line 310 of the partial parity bits on line 312 from register 314 and the bits on line 316 within each incoming frame of the data block.

At the final frame of each data block while register 314 is storing and outputting the final parity of the data block, multiplexer 306 selects the initial value of zero on line 318; otherwise for the non-final frames of each data block, multiplexer 306 selects the partial parity on line 312 for the preceding frame.

The D partial parity bits for each frame number less than the W bits in each frame of the data block. The exclusive-or circuit 308 performs a bit-wise exclusive-or between the D bits on line 312 of the preceding partial parity from register 314 via multiplexer 306 and the corresponding upper D bits of the frame on line 316. The combination on line 310 includes the D bits from the exclusive-or circuit 308 and the lower W−D bits of the frame on line 316.

The exclusive-or circuits of transmitter 302 include subset distributors 320 through 322 and exclusive-or circuits 324 through 326. For each partial parity bit stored in register 314, a respective one of subset distributors 320 through 322 and a respective one of exclusive-or circuits 324 through 326 calculate the partial parity bit from the combination on line 310. In one embodiment, the exclusive-or circuits 324 through 326 are respective exclusive-or trees.

For each partial parity bit, the respective exclusive-or circuit iteratively generates the partial parity bit from an exclusive-or summation of a subset of the combination bits on line 310, and, for each frame, the generated partial parity bit is stored in register 314. The respective subset distributor for each parity bit distributes the appropriate subset of combination bits to the respective exclusive-or circuit. Frequently, the subset distributed by each of the subset distributors 320 through 322 appears to be a pseudo-random subset of approximately half of the combination bits on line 310.

In one embodiment, each partial parity bit stored in register 314 corresponds to a respective row of a generator matrix for a forward error correcting code, and each bit of the combination on line 310 corresponds to a respective column of the generator matrix. Each combination bit in the subset of the respective exclusive-or circuit for each partial parity bit corresponds to a non-zero value of an entry in the generator matrix at the respective row for the partial parity bit and the respective column for the combination bit. Each combination bit not in the subset of the respective exclusive-or circuit for each partial parity bit corresponds to a zero value of an entry in the generator matrix at the respective row for the partial parity bit and the respective column for the combination bit. The subset distributors 320 through 322 distribute to the respective exclusive-or circuits 324 through 326 those of the combination bits on line 310 that are in the appropriate subset.

Thus, the subset distributors 320 through 322 and the exclusive-or circuits 324 through 326 are based on a generator matrix. Modulo division of each of W rows of an augmented matrix $H=[I_{W \times W}|0_{W \times D}]$ by the generator polynomial of degree D results in a remainder matrix $R=[0_{W \times W}|G_{W \times D}^T]$ including the transpose of the generator matrix.

The register 314 stores bits that are iteratively a partial parity for each of the frames of the data block. The register 314 stores the partial parity for each frame, and the partial parity for a final frame is a final parity for the data block.

In one embodiment, the gearbox 328 matches the incoming and outgoing data rates of the transmitter 302. For an example of 10GBASE-KR, each of frame on line 316 of the Q=32 frames of a data block includes W=2080/32=65 message bits. The transmitter 302 generates D=32 final parity bits for each data block. The transmitter 302 receives W=65 message bits each clock cycle, and each clock cycle the transmitter 302 transmits 66 bits that include W=65 message bits and one of the D=32 final parity bits for each data block. Thus, in the 32 clock cycles it takes for the transmitter 302 to receive the Q=32 frames of a data block, the transmitter transmits the Q=32 incoming frames and the D=32 final parity bits for the data block. Alternatively, the transmitter transmits 66 bits each clock cycle with the D=32 final parity bits for each data block appended at the end of the data block. The gearbox 328 stores the information necessary to achieve this matching of the incoming and outgoing data rates of the transmitter 302. In addition, the gearbox 328 includes a frame counter that directs the multiplexer 306 to select the initialization value on line 318 for the initial frame and the partial parity on line 312 for other frames.

The receiver 304 operates similarly to the transmitter 302. In one embodiment, the receiver 304 receives frames on line 330 having more bits than the frames received on line 316 by the transmitter 302. For the example of 10GBASE-KR, each of frame on line 330 of the Q=32 frames of a data block includes W=2112/32=66 message bits. This affects the number of bits on line 332 that are forwarded unmodified through the parallel combiner of receiver 304, and this affects the subsets distributed by distributors 334 through 336. The illustrated receiver 304 omits the function of the gearbox 328 of transmitter 302. Instead, the calculated final parity on line 338 is output in parallel with the frames on line 330. It will be appreciated that a receiver could include a gearbox function.

The illustrated receiver 304 includes a frame counter 340 that controls initialization of the partial parity by multiplexer 342 for the initial frame of each data block, and the frame counter 340 indicates that the partial parity on line 338 is a final parity at the final frame of each data block.

In one embodiment, the receiver 304 receives a data block and generates the final parity on line 338 that is a syndrome of the data block. The syndrome is non-zero in response to corruption of the data block, and non-zero value of the syndrome can isolate and correct the corruption of the data block.

In another embodiment for a shortened block code that is cyclic, the receiver 304 generates the final parity that is a coset leader corresponding to a reverse cyclic shift of a syndrome of the data block by a number of bit shifts corresponding to the shortened size of the data block. Generating this coset leader instead of the syndrome promotes subsequent detection and correction of any corruption in the data block. For an example of 10GBASE-KR, the coset leader results from a forward cyclic shift of the syndrome through the leading 40875 zero bits that shorten the original (42987, 42955) block code. For ease of calculation, this coset leader corresponds to a reverse cyclic shift of the syndrome of the data block by the N=2112 bits of the data block. Calculating this cyclic shift of the syndrome instead of the syndrome itself entails appropriately selecting the subsets distributed by distributors 334 through 336. In general, the updated generator matrix is:

$$U_{D \times W} = P_{D \times D}^{-N} G_{D \times W}$$

where $U_{D \times W}$ is the updated generator matrix, $P_{D \times D}^{-N}$ is the matrix for a reverse cyclic shift by N, and $G_{D \times W}$ is the original generator matrix per frame. The subset distributors 334 through 336 for the parity bits distribute the subset of the bits of the combination on line 344 corresponding to the non-zero entries in the respective row of updated generator matrix for each parity bit. Direct calculation of the coset leader provides lower latency than first calculating the syndrome and then performing a cyclic shift of the syndrome. While the block code needs to a cyclic block code to calculate a coset leader that is a cyclic shift of the syndrome in this embodiment, it will be appreciated that the block code need not by cyclic in other embodiments for generating or checking parity bits.

The embodiments are thought to be applicable to a variety of systems for processing data blocks by frames. Other aspects and embodiments will be apparent to those skilled in the art from consideration of the specification. The embodiments may be implemented as one or more processors configured to execute software, as an application specific integrated circuit (ASIC), or as a logic on a programmable logic device. It is intended that the specification and illustrated embodiments be considered as examples only, with a true scope of the invention being indicated by the following claims.

What is claimed is:

1. A circuit for processing a data block including a first plurality of bits arranged in a plurality of frames, comprising:
   a register configured to store a second plurality of bits, wherein the second plurality of bits is iteratively a partial parity for each of the plurality of frames of the data block;
   a parallel combiner coupled to the register and configured to generate a combination of bits from the second plurality of bits from the register and a third plurality of bits; wherein the third plurality of bits is iteratively those of the first plurality of bits within each of the plurality of frames of the data block;
   a plurality of respective exclusive-or circuits associated with the second plurality of bits, the plurality of respective exclusive-or circuits being coupled to the parallel combiner and the register; and
   wherein each respective exclusive-or circuit is configured to generate a bit of the second plurality from the combination of bits.

2. The circuit of claim 1, further comprising a transmitter configured to transmit the data block together with a final parity that is the second plurality of bits for a final one of the plurality of frames.

3. The circuit of claim 1, further comprising a receiver configured to receive the data block, wherein:
   a final parity is the second plurality of bits for a final one of the plurality of frames; and
   the final parity is a syndrome that is non-zero in response to corruption of the data block.

4. The circuit of claim 1, further comprising a receiver configured to receive the data block, wherein:
   a final parity is the second plurality of bits for a final one of the plurality of frames; and
   the final parity is a coset leader corresponding to a reverse cyclic shift of a syndrome of the data block by a number of bit shifts corresponding to a size of the data block.

5. The circuit of claim 1, wherein the second plurality of bits in the partial parity for each frame numbers less than the third plurality of bits in each frame of the data block.

6. The circuit of claim 5, wherein:
   the parallel combiner includes an exclusive-or circuit configured to perform a bit-wise exclusive-or between bits of the second plurality of bits from the register and corresponding bits of the third plurality of bits; and
   the parallel combiner forwards at least one additional bit of the third plurality of bits that does not correspond to a bit of the second plurality of bits.

7. The circuit of claim 1, wherein:
   the parallel combiner includes an exclusive-or circuit configured to perform a bit-wise exclusive-or between bits of the second plurality of bits from the register and corresponding bits of the third plurality of bits; and
   the parallel combiner forwards at least one additional bit of the third plurality of bits that does not correspond to a bit of the second plurality of bits.

8. The circuit of claim 1, wherein:
   the respective exclusive-or circuit for each bit of the second plurality of bits is configured to generate the bit of the second plurality of bits from an exclusive-or summation of a subset of a fourth plurality of bits of the combination of bits;
   each bit of the second plurality of bits corresponds to a respective row of a generator matrix for a forward error correcting code, and each bit of the fourth plurality of bits corresponds to a respective column of the generator matrix;
   each bit of the fourth plurality of bits in the subset of the respective exclusive-or circuit for each second bit corresponds to a non-zero value of an entry in the generator matrix at the respective row for the second bit and the respective column for the bit of the fourth plurality of bits; and each bit of the fourth plurality of bits not in the subset of the respective exclusive-or circuit for each second bit corresponds to a zero value of an entry in the generator matrix at the respective row for the bit of the second plurality of bits and the respective column for the bit of the fourth plurality of bits.

9. The circuit of claim 8, wherein the plurality of respective exclusive-or circuits is based on the generator matrix, wherein:
the second plurality of bits numbers D bits and a degree of a generator polynomial equals D;
the third plurality of bits and the fourth plurality of bits both number W bits; and
modulo division of each of W rows of an augmented matrix $H=[I_{W\times W}|0_{W\times D}]$ by the generator polynomial results in a remainder matrix $R=[0_{W\times W}|G_{W\times D}{}^T]$ including the transpose of the generator matrix.

10. The circuit of claim 1, wherein the respective exclusive-or circuit associated with each bit of the second plurality of bits is configured to iteratively generate the bit of the second plurality of bits stored in the register for each of the plurality of frames other than a final frame of the plurality of frames.

11. The circuit of claim 10, wherein the register is configured to initialize to an initial value of zero for the initial frame of the plurality of frames.

12. The circuit of claim 10, wherein the plurality of respective exclusive-or circuits associated with the second plurality of bits is configured to generate a final parity at the final frame.

13. The circuit of claim 1, wherein the respective exclusive-or circuit associated with each second bit is configured to iteratively generate the bit of the second plurality of bits stored in the register for each of the plurality of frames.

14. The circuit of claim 13, wherein:
the register is configured to store the partial parity: and
the partial parity for a final frame of the plurality of frames is a final parity for the data block.

15. The circuit of claim 14, further comprising a transmitter configured to transmit the data block together with the final parity.

16. The circuit of claim 14, further comprising a receiver configured to receive the data block, wherein:
the final parity is a syndrome of the data block; and
the syndrome is non-zero in response to corruption of the data block.

17. The circuit of claim 1, further comprising a counter for the plurality of frames, wherein:
the counter controls initialization of the partial parity for an initial one of the plurality of frames; and
the counter indicates that the partial parity for a final one of the plurality of frames is a final parity for the data block.

18. A circuit for processing a data block including a first plurality of bits, comprising:
a register configured to store a second plurality of bits;
wherein the second plurality of bits is iteratively a partial parity for each frame of a plurality of frames of the data block;
a parallel combiner coupled to the register and configured to generate a bit-wise exclusive-or combination of bits from the second plurality of bits from the register and corresponding ones of a third plurality of bits;
wherein the third plurality of bits is iteratively those bits of the first plurality of bits within each of the plurality of frames of the data block; and
a plurality of respective exclusive-or circuits associated with the second plurality of bits, the plurality of respective exclusive-or circuits being coupled to the parallel combiner and the register,
wherein:
the respective exclusive-or circuit associated with each bit of the second plurality of bits is configured to generate the bit of the second plurality of bits from an exclusive-or summation of a subset of a fourth plurality of bits of the bit-wise exclusive-or combination of bits; and
each bit of the fourth plurality of bits in the subset of the respective exclusive-or circuit for each bit of the second plurality of bits corresponds to a non-zero value of an entry in a generator matrix at a respective row for the bit of the second plurality of bits and a respective column for the bit of the fourth plurality of bits.

19. A processor-implemented method for generating a circuit for processing a data block, comprising:
inputting a number W, wherein each frame of a plurality of frames of the data block includes W bits;
inputting a specification of a generator polynomial, the specification specifying a number D that is equal to a degree of the generator polynomial;
calculating, by a processor, a generator matrix from the generator polynomial, the generator matrix having D rows and W columns;
generating a description of a register that iteratively stores D bits of a partial parity for each frame of the plurality of frames;
generating a description of a parallel combiner that iteratively generates W bits of a combination of bits for each frame of the plurality of frames, the W bits of the combination of bits including a bit-wise exclusive-or between the D bits of the partial parity from the register and D of the W bits in the frame;
generating a description of D exclusive-or circuits that iteratively generate the D bits of the partial parity for each successive frame of the plurality of frames, a respective one of the D exclusive-or circuits associated with each bit of the D bits generating the bit from a corresponding subset of the W bits of the combination of bits;
wherein the corresponding subset includes each bit of the W bits for which the generator matrix includes a non-zero entry at a respective row of the D rows for the bit of the D bits and a respective column of the W columns for the one of the W bits; and
outputting the descriptions of the register, the parallel combiner, and the D exclusive-or circuits.

20. The processor-implemented method of claim 19, wherein the calculating of the generator matrix includes:
generating an augmented matrix that includes an identity matrix and a first zero matrix, wherein the identity matrix has W rows and W columns, and the first zero matrix has W rows and D columns;
generating a remainder matrix from modulo division of each of W rows of the augmented matrix by the generator polynomial, the remainder matrix including a second zero matrix and a transpose of the generator matrix;
wherein the second zero matrix has W rows and W columns, and the transpose of the generator matrix has W rows and D columns; and
extracting the generator matrix having D rows and W columns from the remainder matrix.

* * * * *